United States Patent [19]

Kondo

[11] 4,311,266

[45] Jan. 19, 1982

[54] SOLDERING APPARATUS

[76] Inventor: Kenshi Kondo, c/o Nihon Dennetsu Keiki Kabushiki Kaisha, No. 27-1, Shimomaruko 2 chome, Ohta-ku, Tokyo, Japan

[21] Appl. No.: 104,723

[22] Filed: Dec. 18, 1979

[30] Foreign Application Priority Data

Dec. 25, 1978 [JP] Japan ................................ 53-158659
Dec. 25, 1978 [JP] Japan ................................ 53-158600

[51] Int. Cl.³ ............................................ H05K 3/34
[52] U.S. Cl. ........................................ 228/40; 228/43;
228/180 R; 228/259; 134/83; 198/342
[58] Field of Search .............. 228/179, 180 R, 180 A, 228/185, 256, 259, 260, 36, 37, 40, 43, 47, 49 R; 198/342; 134/49, 83, 125, 165

[56] References Cited

U.S. PATENT DOCUMENTS 3,828,419 8/1974 Wanner .................. 228/40 X

FOREIGN PATENT DOCUMENTS 52-5417 2/1977 Japan .................... 228/36

*Primary Examiner*—Gil Weidenfeld
*Assistant Examiner*—Kenneth Ramsey
*Attorney, Agent, or Firm*—Stephen F. K. Yee

[57] ABSTRACT

An apparatus for soldering printed circuit boards includes a carrier adapted to support a printed circuit board and to be moved along a predetermined transfer path, preferably in the form of a closed loop; a pair of laterally spaced movable rails defining a part of the transfer path and adapted for supporting engagement with the carrier; a vessel containing molten solder placed beneath the space between the rails; and driving means for moving the rails up and down to allow the printed circuit board to be dipped in the molten solder.

10 Claims, 44 Drawing Figures

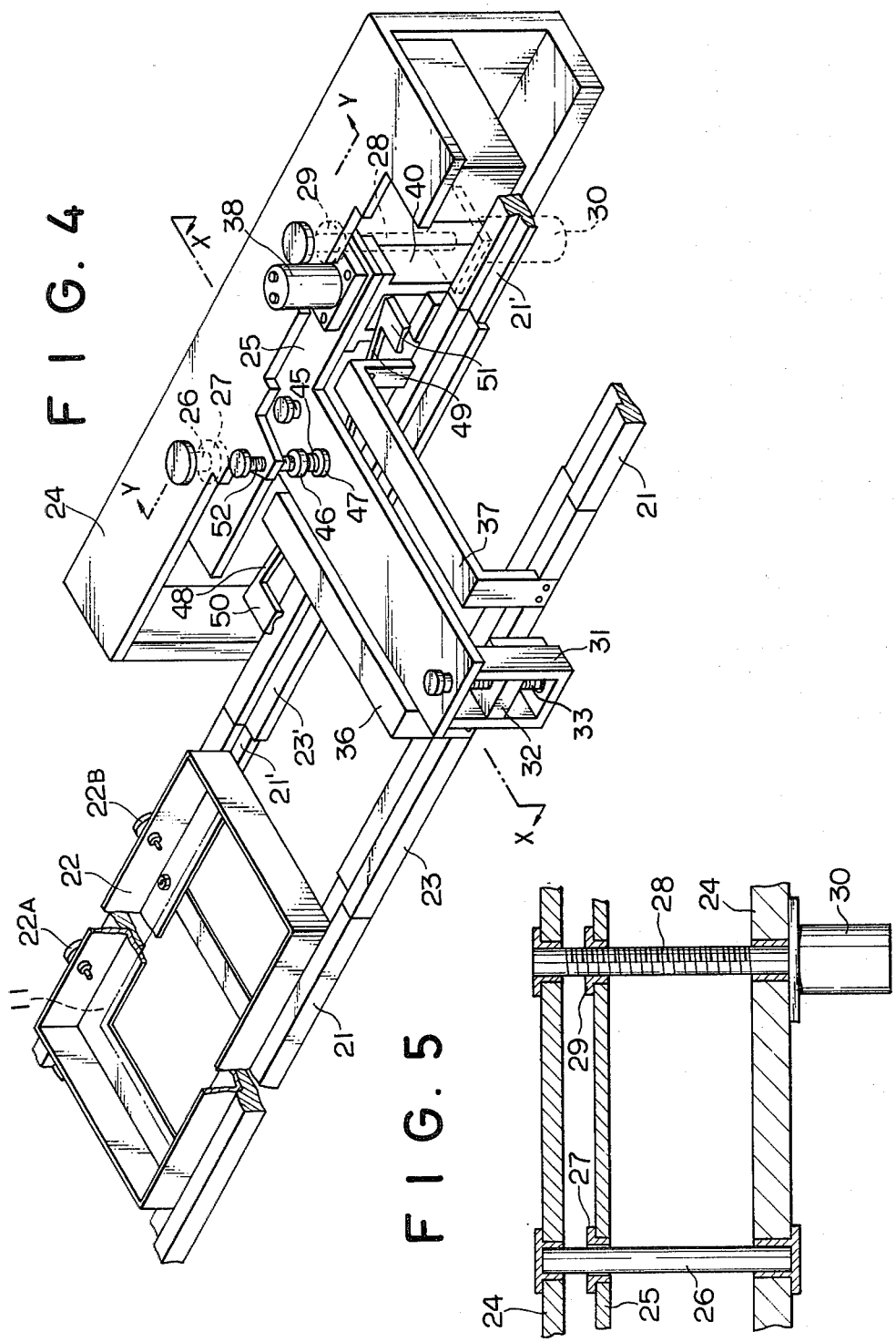

F I G. 13 (a)
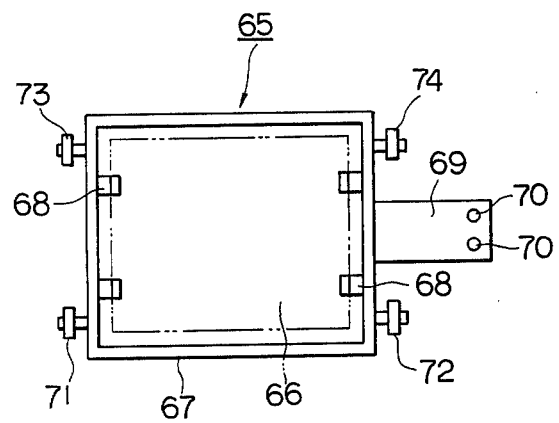
F I G. 13 (b)
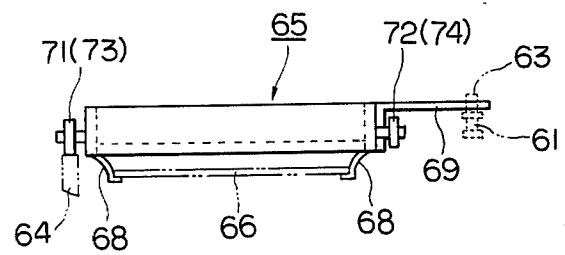

SOLDERING APPARATUS

BACKGROUND OF THE INVENTION

This invention relates to an apparatus for soldering electronic parts and the like to a printed circuit board by the so-called dipping method, and more particularly to a soldering apparatus for applying solder uniformly on a flat soldering surface of the printed circuit board.

The conventional procedure for mounting electronic parts such as resistors and capacitors on a printed circuit board has been to insert lead wires of the electronic parts in the holes which are provided in the conductive portions of the printed circuit board and to dip them in molten solder to solder them in the respective positions. In such a case, the flat soldering face on the underside of the printed circuit board is maintained parallel with the surface of the molten solder during the dipping operation. Therefore, a great force is required at the instant of disengaging the soldering face from the surface of the molten solder, and unnecessary solder tends to remain on the underside of the printed circuit board, forming solder bridges or resulting in uneven finished surfaces. There has also been a problem of incomplete soldering due to the gases which are trapped between the soldering face and the surface of the molten solder when contacting them.

Problems are encountered also in soldering apparatus of the type where a printed circuit board is supported on a carrier which is circulated along a transfer path in the form of a closed loop and dipped in molten solder in a solder vessel which is provided at a predetermined position in the transfer path. As shown in FIG. 1, in this type of soldering apparatus, a printed circuit board 2 with parts to be soldered 1 is detachably held on a carrier 3 which has its front and rear wheels 4 and 5 mounted on a transfer rail 6, the carrier 3 being driven along the transfer rail 6 by a conveyor chain (not shown). The transfer rail 6 is gradually lowered by a relatively long downward slope II to have a flat sunken portion III over a solder vessel 7 and then raised to the initial transfer level by an upward slope IV which succeeds the flat sunken portion III. When the carrier 3 is on the flat sunken portion III, the underside of the printed circuit board 2 is dipped in the solder vessel 7 to solder the parts 1 to the board 2, thereafter lifting the carrier 3 to the level V along the upward slope IV. The carrier 3 is lowered and lifted in this manner to effect the soldering.

In this apparatus, in order to guide the printed circuit board 2 into the solder vessel, it is necessary to introduce the fore end of the printed circuit board 2 into the solder vessel 7 while its rear portions are still going down the slope II. Therefore, the sunken portion III must have a large distance $L_1$ with long slopes II and IV of an easy grade. In addition, the solder vessel 7 is required to have a large length in the direction of travel of the carrier 3. As a result, there arise problems such as the increased size of the apparatus as a whole, the need for a larger amount of molten solder and for a greater amount of heat for maintaining the solder in molten state.

BRIEF DESCRIPTION OF THE DRAWINGS

Other objects, features and advantages of the invention will become apparent from the detailed description of the preferred embodiments of the invention which follows, when considered in light of the accompanying drawings, in which:

FIG. 4 is a perspective view showing one embodiment of the soldering apparatus of the invention;

FIG. 5 is a cross-sectional elevational view taken on line Y—Y of FIG. 4.

FIGS. 13(a) and 13(b) are plan and side elevational views, respectively, diagrammatically showing a carrier of FIG. 12.

DESCRIPTION OF PREFERRED EMBODIMENTS

Referring to FIG. 2 illustrating the sequence of the soldering operation according to one embodiment of the present invention, indicated at 11 is a printed circuit board, at 12 a flat soldering face of the board 11, at 13 an electronic part, at 14 lead wires of the electronic part 13, at 15 a solder vessel, 16 molten solder, and at 17 the surface of the molten solder 16.

The printed circuit board 11 is processed in the following manner.

Figure 2A:
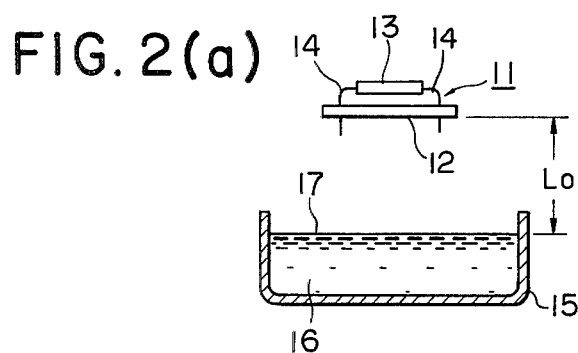
FIGS. 2(a) to 2(g) are diagrammatic views showing a sequence of the soldering operation according to the present invention.
Figure 2E:
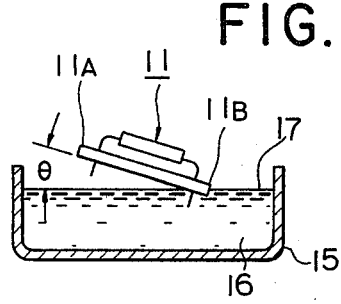
Figure 2B:
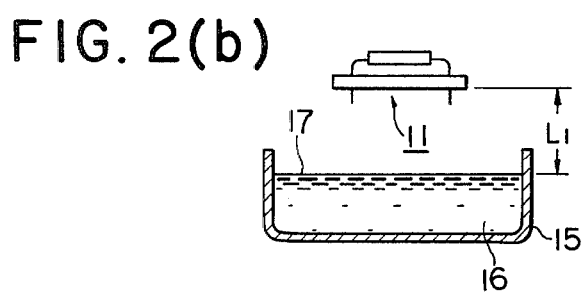
Figure 2F:
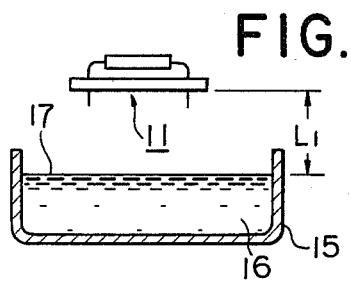
Figure 2C:
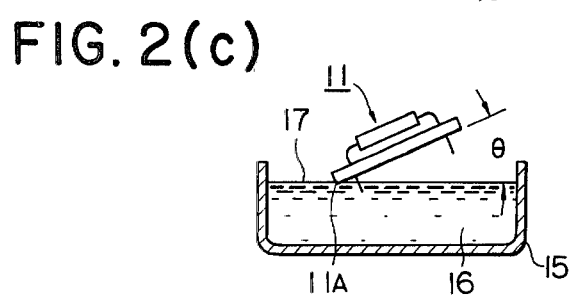
Figure 2G:
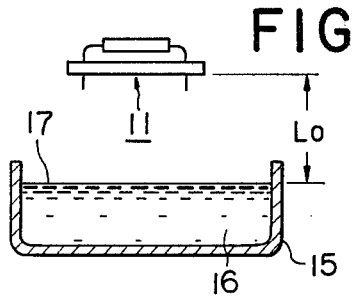
Figure 2D:
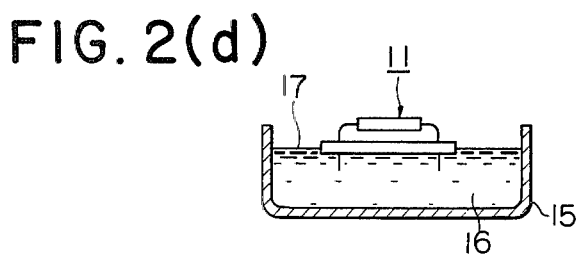

FIG. 2(a) shows a stage before initiating the soldering operation, in which the printed circuit board 11 and the solder surface 17 are held at a distance $L_0$. In the initial stage of the soldering operation, the printed circuit board 11 is lowered in horizontal state to a level spaced from the solder surface 17 by a distance $L_1$ as shown in FIG. 2(b). In the next stage, the printed circuit board 11 is gradually forwardly tilted to have its fore end 11A dipped in the molten solder 16 at a predetermined angle of inclination $\theta$ as shown in FIG. 2(c). Next, the printed circuit board 11 is turned about its fore end 11A which is dipped in the molten solder 16, gradually reducing the angle of inclination until the entire lower surface of the board 11 is dipped in the molten solder 16, as shown in FIG. 2(d). In the succeeding stage, the fore end 11A is raised by turning the printed circuit board 11 gradually about its rear end 11B which is still dipped in the molten solder through a predetermined angle $\theta$ as shown in FIG. 2(e). In the stage of FIG. 2(f), the rear end 11B is turned up to hold the printed circuit board 11 again in horizontal stage as in FIG. 2(b). In the last stage, the printed circuit board 11 is lifted in horizontal state up to the original transfer level spaced from the solder surface 17 by a distance $L_0$ as shown in FIG. 2(g), thus completing the soldering operation.

In the above soldering operation, the printed circuit board 11 is contacted with the molten solder 16 for the same time period in every part of the soldering face 12 to ensure uniform application of the solder. In addition, there are no problems which arise when the soldering face is contacted with the solder all at once.

Although the printed circuit board 11 is originally positioned to have its soldering face 12 at the distance $L_0$ from the surface 17 of the molten solder 16 in the soldering operation of FIG. 2, it may be directly positioned at the distance $L_1$ prior to the forwardly tilting operation, omitting the parallel lowering stage of FIG. 2(b).

FIG. 3 shows the sequence of a modified soldering operation according to the invention, which is characterized in that the printed circuit board 11 is rotated about its transverse axis (between the fore and rear ends 11A and 11B) in the tilting operation, differing from the operation of FIG. 2 where the printed circuit board 11 is tilted by rotations about its fore end and rear ends 11A and 11B. In FIG. 3, only the printed circuit board 11 and solder surface 17 are shown for simplicity of illustration.

As shown in FIG. 3, the printed circuit board 11 is initially positioned at a distance $L_0$ from the surface 17 of the molten solder. In the next stage, it is lowered to the position which is at the disance $L_1$ as shown in FIG. 3(b). Then, the printed circuit board 11 is further lowered and simultaneously forwardly tilted by turning same about its transverse axis O as shown in FIG. 3(c), forming an angle of inclination $\theta$. In the stage of FIG. 3(d), the printed circuit board 11 is further lowered and tilted, forming a maximum angle of inclination $\theta_2$ to have its fore end 11A dipped in the molten solder 16. In the succeeding lowering movement, the angle of inclination is reduced as shown in FIG. 3(e) by turning the printed circuit board in the reverse direction, so that the dipped area of the soldering face propagages toward its rear end 11B and the entire soldering face is dipped as shown in FIG. 3(f). Thereafter, the printed circuit board 11 is tilted rearward by turning same further in the reverse direction about its transverse axis O, raising the fore end 11A as shown in FIG. 3(g). In this stage, the printed circuit board 11 is disengaged from the solder surface 17 gradually from its fore end 11A, with the rear end 11B still dipped in the solder. As soon as the angle of inclination becomes the predetermined angle $\theta$, shown in FIG. 3(h), the printed circuit board 11 is lifted while it is turned in the reverse direction to reduce the angle of inclination. Therefore, the printed circuit board 11 is brought to horizontal state as shown in FIG. 3(j) through the stage of FIG. 3(i) and held at the distance $L_1$ from the solder surface 17. Finally, the circuit board is further lifted to the position of FIG. 3(k) to return to the initial level. By imparting vertical and rotational movements in this manner, it becomes possible to effect the soldering uniformly over the entire soldering face of the printed circuit board.

In the foregoing description, the printed circuit board 11 is moved in the vertical directions toward and away from the solder surface. However, arrangements may be made to add parallel or horizontal movement to the vertical movements, if desired. More particularly, it is possible to move the printed circuit board 11 when it is lowered in tilted state in the dipping stage. The horizontal movement may also be imparted when the printed circuit board 11 is lifted in the reversely tilted state. In such a case, the printed circuit board 11 may be brought into and out of contact with the solder surface by the so-called rolling or pitching movement, contacting or disengaging one side or the fore end of the printed circuit board prior to the other side or the rear trailing end thereof.

The subsequent figures of the accompanying drawings show the apparatus for carrying out the above-discussed soldering operation, of which FIGS. 4 to 11 illustrate an apparatus for conducting the operation of FIG. 3. In these figures, the reference numerals 21 and 21' denote a pair of parallel stationary guide rails for guiding therealong a carrier 22 for a printed circuit board 11. Indicated at 23 and 23' are a pair of parallel movable guide rails which are inserted in the hiatuses in the guide rails 21 and 21', respectively, and which are imparted with lowering and rocking movements as will be described hereinlater. A support housing 24 which is fixed on a base structure, for example, on a table supports thereon a T-shaped lifter plate member 25 movable in the upward and downward directions. More particularly, as shown in FIG. 5, one arm of the lifter plate 25 has a bearing 27 which is loosely fitted on a vertical guide pin 26 which is fixed on the support housing 24. The other arm of the lifter plate 25 is provided with a nut 29 in meshing engagement with a vertical feed screw 28 which is fixed on the support housing 24. The feed screw 28 is driven from a motor 30 to rotate and stop with predetermined timing. Thus, the lifter plate 25 is supported at one end thereof and, as the feed screw 28 is rotated, the nut 29 is moved upward or downward while the bearing 27 on the opposite arm is guided along the guide pin 26, moving the lifter plate 25 upward or downward according to the forward or reverse rotation of the motor 30.

Figure 6:
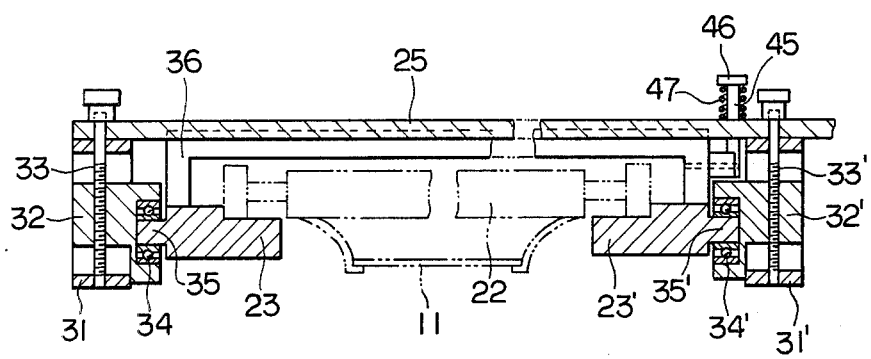
FIG. 6 is a cross-sectional elevational view taken on line X—X of FIG. 4.
Figure 7:
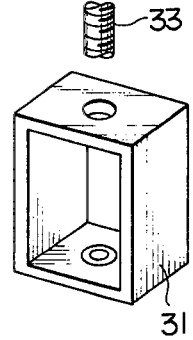
FIG. 7 is an enlarged perspective view showing a movable guide frame of FIG. 4.
Figure 8:
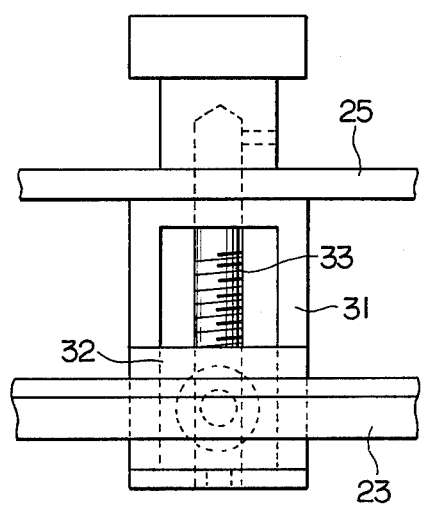
FIG. 8 is an enlarged side elevational view of FIG. 6.

As shown in FIGS. 6 to 8, guide frames 31 and 31' are opposingly secured to the lower side of the lifter plate 25 at the opposite ends thereof, the guide frames 31 and 31' having movable elements 32 and 32', respectively, for upward and downward movements therein. The movable elements 32 and 32' are centrally provided with internally threaded bores for meshing engagement with fine adjustment screws 33 and 33', respectively, which are permitted of rotational movement alone. The movable elements 32 and 32' have bearings 34 and 34' mounted on the opposing inner walls thereof for fitting engagement with pins 35 and 35' projecting outwardly from the longitudinal center portions of the respective movable guide rails 23 and 23'. The movable guide rails 23 and 23' are linked by connecting bridges 36 and 37. Therefore, the movable guide rails 23 and 23' are rockable about the center of the bearings 34 and 34', respectively.

Figure 9:
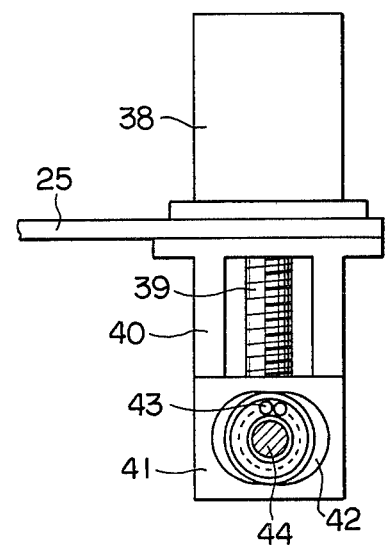
FIG. 9 is a side elevational view, taken on line Z—Z in FIG. 10, showing a drive motor and associated parts for movable guide rails.
Figure 10:
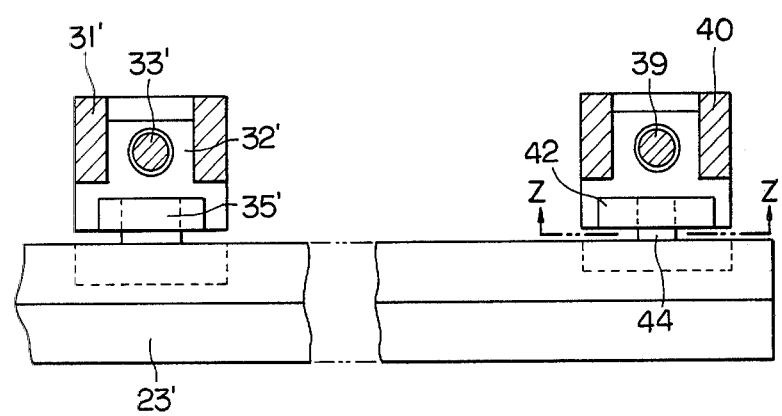
FIG. 10 is a fragmentary plan view, partly in cross-section, showing the support mechanism for the movable guide rails.

In order to control the just-mentioned rocking movement of the movable guide rails 23 and 23', a motor 38 is mounted on the arm of the lifter plate 25, the motor 38 having a downwardly extending feed screw 39 as shown in FIGS. 9 and 10. On the other hand, a guide frame 40 is secured to the arm of the lifter plate 25 at a position opposing the motor 38. A movable element 41 is received in the guide frame 40 for upward and downward movements therein. The movable element 41 is centrally provided with an internally threaded bore for meshing engagement with the feed screw 39. The movable element 41 is further provided with a bore 42 to receive a bearing 43. The bore 42 is formed in the shape of an elongated slot to allow a play or sideward movements of the bearing 43. The bearing 43 is in turn fittedly engaged by a pin 44 which is fixed on the movable guide rail 23'. With this arrangement, the movable element 41 is moved upward or downward by the forward or reverse rotation of the motor 38, causing the movable guide rails 23 and 23' to rock about the pins 35 and 35', respectively.

Figure 11A:
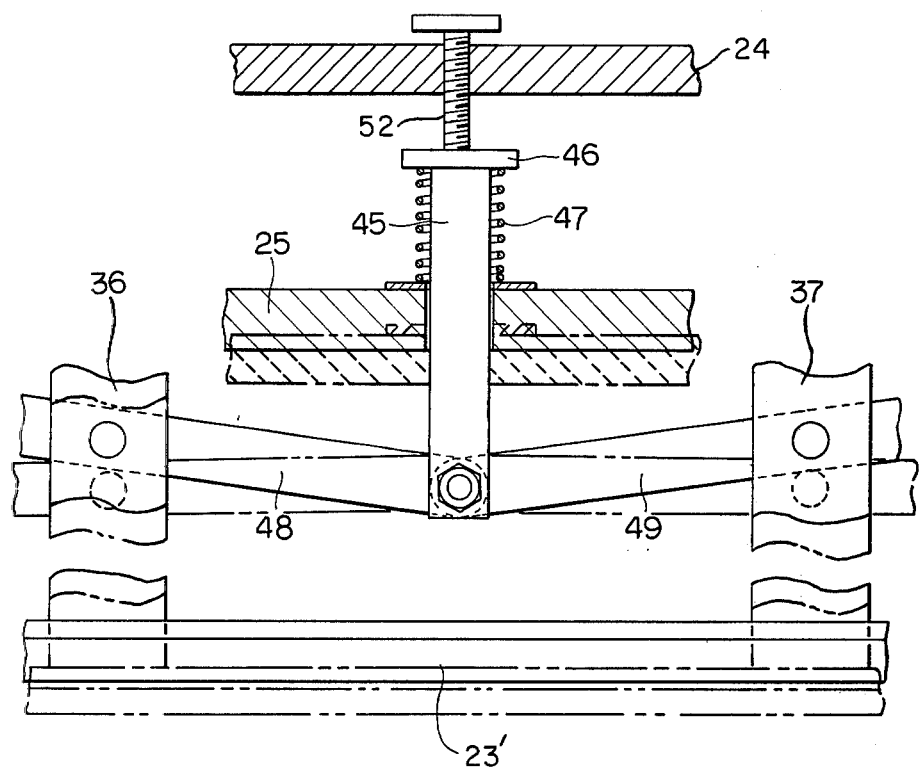
FIGS. 11(a) and 11(b) are a fragmentary elevational view and a fragmentary plan view, respectively, showing a clamping mechanism for holding the carrier on the movable guide rails.
Figure 11B:
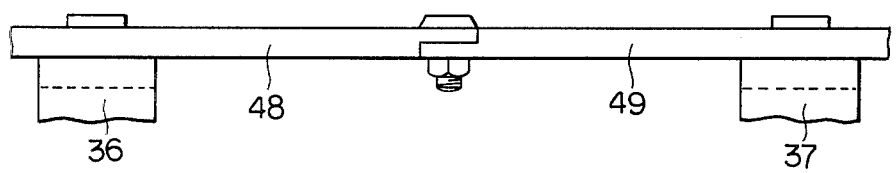

FIGS. 4 and 11 illustrates a mechanism to clamp the carrier 22 on the movable guide rails 23 and 23'. As shown in FIGS. 11(a) and 11(b), an operating rod 45 is vertically movably fitted in a bore which is provided substantially at the center of the lifter plate 25. A spring 47 is inserted between a head portion 46 of the operating rod 45 and the lifter plate 25 to urge the operating rod 45 upward. The lower end of the operating rod 45 is pivotally connected to one end of arms 48 and 49 which are in the respective middle portions pivotally supported on the connecting bridges 36 and 37 and provided with roller pressers 50 and 51 at the respective distal ends (FIG. 4). It is preferred to provide relative large holes at the inner ends of the arms 48 and 49 for pivotal connection to the lower end of the operating rod 45 so that the arms 48 and 49 are rockable about the pivotal points on the connecting bridges 36 and 37, respectively. On the other hand, mounted above the operating rod 45 is a stopper 52 which is threaded into the support housing 24 as shown in FIGS. 4 and 11(a) and rotatable therein for the adjustment of the position of its distal end.

When the lifter plate 25 is in its upper position, the head of the operating rod 45 is blocked by the stopper 52 so that the arms 48 and 49 are held in the positions indicated in solid line in FIG. 11(a), holding the respective roller pressers 50 and 51 in the respective lifted positions without any clamping actions.

When the rails 23, 23' are lowered by operation of the motor 30, the lifter plate 25 and the connecting bridges 36, 37 connected to the rails, are moved downwardly at the same time, into the relative positions shown in phantom in FIG. 11(a). However, due to the action of the spring 47, which normally urges the head 46 of the operating rod 45 into contact with the lower end of the stopper 52, the operating rod does not move. As a consequence, when the rails 23, 23' are moved downwardly, the arms 48 and 49 are rotated about their respective pivots on the connecting bridges 36 and 37, into positions indicated by the phantom lines to clamp the carrier 22 on the rails 23, 23', with the roller pressers 50, 51 contacting the rollers 22A and 22B, respectively. The common pivot of the arms 48, 49 and the operating rod 45 remains stationary vertically.

The operation of the above-described apparatus is given below with reference to FIG. 4.

A printed circuit board 11 is mounted on the carrier 22 as shown in phantom in FIG. 4. As the carrier 22, which is moved along the guide rails 21 and 21' by a suitable transfer means, is transferred onto the movable guide rails 23 and 23', the motor 30 is started to lower the lifter plate 25 from the position of FIG. 3(a) to the position of FIG. 3(b). As mentioned hereinbefore, the connecting bridges 36 and 37 are lowered as a result of this lowering of the lifter plate 25, and with the operating rod remaining stationary the arms 48 and 49 are rotated about their respective pivots on the connecting bridges to lower the respective roller pressers 50 and 51 thereby to hold from above the rollers 22A and 22B which are fixedly mounted at one side of the carrier 22. As a result, the carrier 22 is fixed on the movable guide rails 23 and 23'.

Figure 3A:
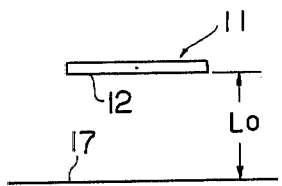
FIGS. 3(a) to 3(k) are diagrammatic views showing a sequence of another soldering operation also attained by the apparatus of the present invention.
Figure 3B:
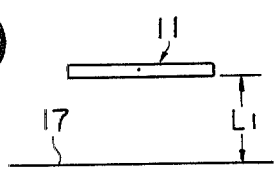
Figure 3C:
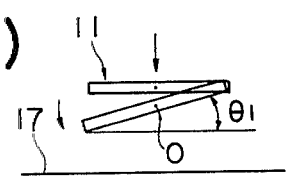
Figure 3D:
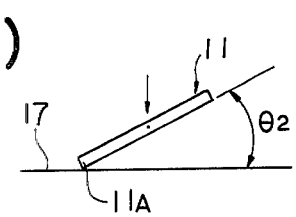
Figure 3E:
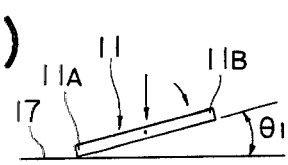
Figure 3F:
Figure 3G:
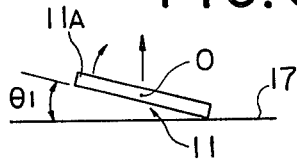
Figure 3H:
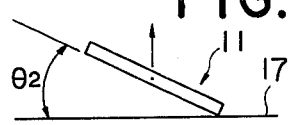
Figure 3I:
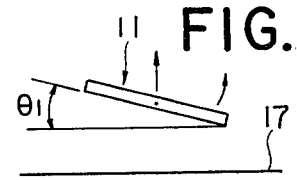
Figure 3J:
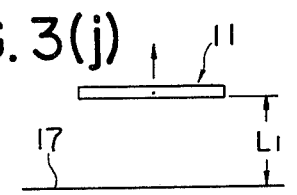
Figure 3K:
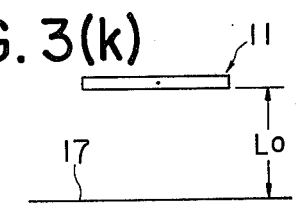

As soon as the lifter plate 25 is lowered to a predetermined position (FIG. 3(b), the motor 38 is also started to tilt gradually the holder 22 which holds the printed circuit board 11. Therefore, the printed circuit board 11 on the holder 22 is also tilted until its one end is dipped under the surface of the molten solder as shown in FIG. 3(d). The rotation of the motor 38 is then reversed to reduce the angle of inclination of the printed circuit board 11 until the position of FIG. 3(f) is attained. At this time point, the rotation of the motor 30 alone is reversed to tilt the carrier 22 and printed circuit board 11 in the reverse direction as shown in FIG. 3(g). Upon attaining the position of FIG. 3(h), the rotation of the motor 38 alone is reversed to reduce the angle of inclination as shown in FIG. 3(i), finally bringing the printed circuit board 11 to the horizontal position of FIG. 3(j). The motor 38 is then stopped, lifting the whole structure to the initial level of FIG. 3(k) by the operation of the motor 30. In this stage of operation, the head portion 46 of the operating rod 45 is blocked by the stopper 52 to lower the former relative to the lifter plate 25. As a result, the arms 48 and 49 are rocked to lift the respective roller pressers 50 and 51, thereby releasing the carrier 12. Then, the carrier 22 is pushed on the guide rails 21 and 21' on the opposite side of the clamping mechanism.

In this manner, the printed circuit boards 11 on the carriers 22 which come along the guide rails 21 and 21' are successively soldered.

It is to be noted that the presser rollers 50 and 51 which are employed as a clamping mechanism in the foregoing embodiment may be replaced by any other suitable means which is adapted to clamp the holder 22 for the printed circuit board 11.

Figure 12:
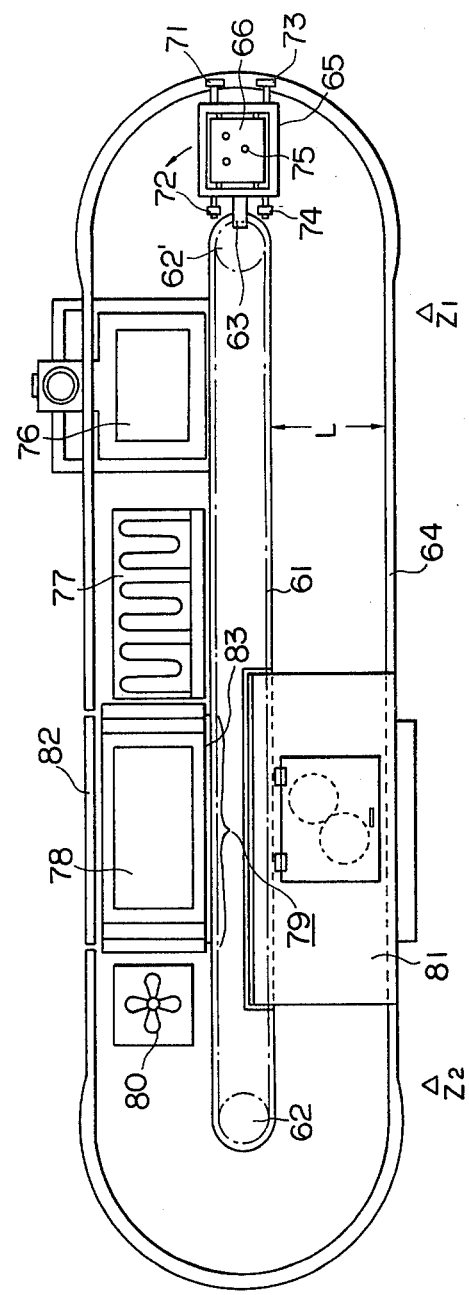
FIG. 12 is a plan view diagrammatically showing another embodiment of the soldering apparatus according to the invention.

FIG. 12 shows in plan view a soldering apparatus according to the present invention. In FIG. 12, denoted at 61 is an endless conveyor chain which is passed around a pair of sprocket wheels 62 and 62' which is provided on a base frame (not shown) and one of which is driven to rotate the conveyor chain 61 constantly therearound. The conveyor chain 61 is planted with a number of pins 63 at suitable intervals along the length thereof for engagement with carriers which are transferred as will be described hereinlater. Shown at 64 is a looped conveyor rail which is provided on the base frame and at a predetermined distance L from the conveyor chain 61.

FIGS. 13(a) and 13(b) show in plan and side views a carrier 65 which runs along the conveyor rail 64, supporting thereon a printed circuit board 66. The carrier 65 includes a frame 67 which has on its underside a pair of inwardly acting springs 68 to grip therebetween the printed circuit board 66. The frame 67 has at its one side a holder member 69 with apertures 70, one of which is engageable with one of the above-mentioned pins 63 of the conveyor chain 61. At the opposite side away from the holder member 69, the frame 67 is provided with first front and rear wheels 71 and 73, preferably in the symmetrical positions relative to the center line of the carrier thereby to support the carrier on the rail 64.

Referring to FIG. 12, a printed circuit board 66 which has the soldering parts 75 inserted thereinto is mounted on the carrier 65 at point $Z_1$. The carrier 65 and the printed circuit board 66 which is supported on the carrier 65 are transferred normally in horizontal state along a predetermined looped transfer path by the conveyor chain 61.

The transfer path contains suitable processing zones. The carrier 65 which has started at the point $Z_1$ is firstly passed through a flow-dip fluxer zone 76 to apply flux on the printed circuit board 66 and then through a preheating zone 77 to heat the circuit board 66 before reaching a soldering zone 79 including a solder vessel 78. Thereafter, the carrier 65 is passed through a cooling zone 80 to cool the printed circuit board 66, for example, by a fan and then fed to a cutter 81 to cut off the lead wires which depend from the printed circuit board 66. The printed circuit board 66 is passed again through the fluxer zone 76 and the preheating zone 77 to finish its soldered portions at the soldering zone 79 and, after being passed through the cooling zone 80, removed from the carrier 65 at point $Z_2$. Although only one carrier 65 is shown in FIG. 12, it is to be understood that in actual operation a number of carriers are fixed on the pins 63 of the conveyor chain at suitable intervals along the length thereof, transferring the corresponding number of printed curcuit boards along the transfer path to subject them successively to the soldering treatment.

Referring further to FIG. 12, the transfer rail 64 is interrupted at the soldering zone 79 and the interrupting space is complemented by a movable rail (or a first track member) 82. Another movable rail (or a second track member) 83 of similar construction is located on the other side of the solder vessel 78 in parallel relation with the first track member 82. The first and second track members 82 and 83 are movable between the respective upper and lower positions. The transfer chain 61 is lowered at the processing zone 79 so that the carrier 65 is supported by the movable rails alone in the soldering zone 79.

Figure 14:
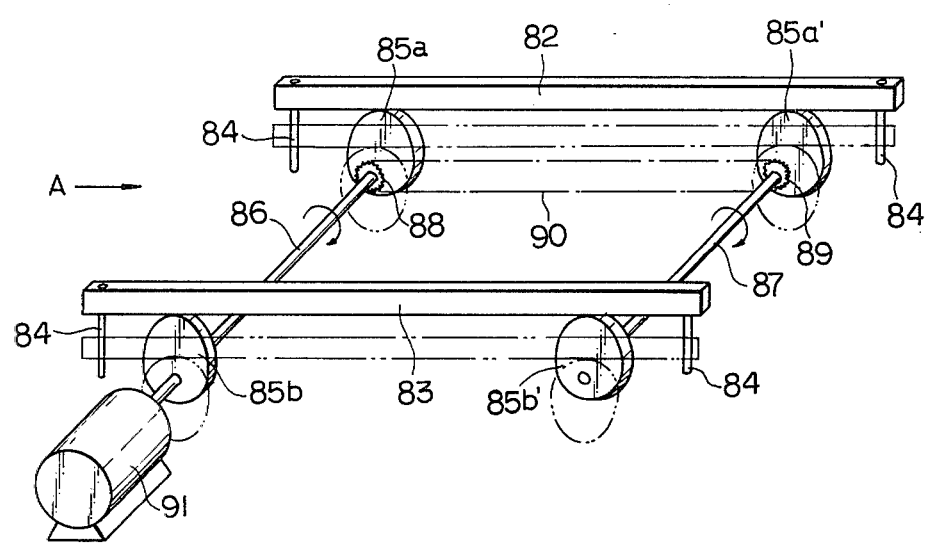
FIG. 14 is a perspective view schematically showing a cam mechanism for moving first and second track members up and down.

FIG. 14 shows one example of the first and second track members. In this example, the first and second track members 82 and 83 are each provided with through-holes at opposite ends thereof to receive pins 84 which are planted on a base structure (not shown). In the opposite end portions, the first and second track members 82 and 83 are supportingly engaged on the underside thereof by cams 85a, 85a', 85b and 85b', of which the cams 85a and 85b are fixed on a shaft 86 which is extended perpendicular to the track members 82 and 83 while the cams 85a' and 85b' are fixed on a shaft 87 which is extended parallel to the shaft 86. Gears 88 and 89 are fixedly mounted on the shafts 86 and 87, respectively, the two gears 88 and 89 being linked by a chain 90. One extended end of the shaft 86 is coupled to an output shaft of a drive mechanism including a motor 91. With such arrangement, if the motor 91 is actuated, the rotational movement is imparted to the shafts 86 and 87, causing the cams 85a, 85b, 85a' and 85b' to rotate about the respective shafts. While the cams 85a, 85b, 85a' and 85b' make one revolution from the positions indicated in solid line in FIG. 14 (lifting positions), the first and second track members which are supported on the cams are gradually lowered along the pins 84 in horizontal state and in level with each other and, after reaching the positions indicated in broken line (lower positions), they are lifted to return to the initial positions.

When the carrier 65 which supports thereon the printed circuit board 66 is brought to the soldering zone by the transferring operation of the conveyor chain 61 along the transfer rail 64 and its rear wheels 73 and 74 ride on the first and second track members, this is detected by a limit switch or other suitable detecting means (not shown) to start the motor 91. Therefore, the carrier 65 which is moving on the first and second track members is lowered in parallel relation with the surface of the molten solder, dipping the underside of the printed circuit board 66 in the molten solder when the first and second track members reach the lowermost positions to effect the soldering. The printed circuit board 66 on the continually advancing carrier 65 is then lifted in horizontal state to disengage from the solder surface. While the front wheels 71 and 72 of the carrier 65 are still on the track members 82 and 83, the latter are returned to the uppermost positions to allow the former to move onto the transfer rail 64.

Figure 1:
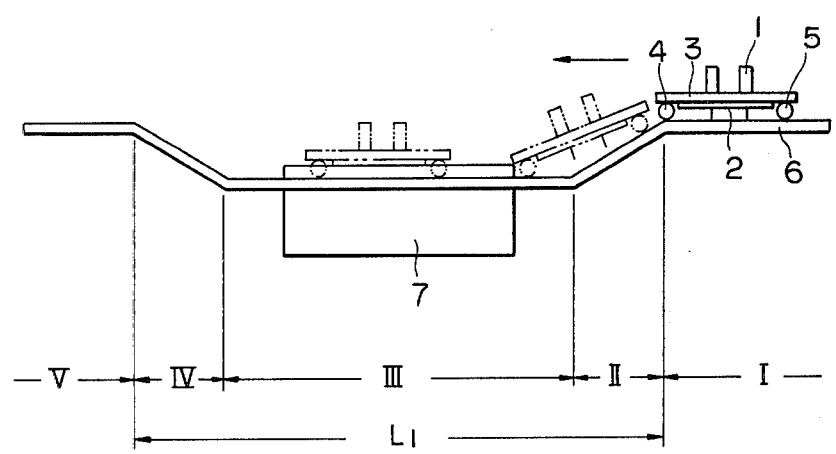
FIG. 1 is a fragmentary view diagrammatically showing the manner in which a printed circuit board is guided into a solder vessel in a prior art apparatus.

Thus, the distance of transfer (the length of the track members) necessary for soldering the printed circuit board 66 is shorter than the distance $L_1$ of FIG. 1. This means that it is possible to shorten the length of the solder vessel 78 in the direction of travel of the carrier 65. In addition, it is also possible to roll the printed circuit board in the direction perpendicular to the direction of its travel by employing different shapes for the cams 85a, 85a', 85b and 85b', thereby eliminating the previously-mentioned drawbacks of the conventional soldering apparatus. This rolling operation is described hereafter with reference to FIG. 15.

In the embodiment of FIG. 15, the cams 85a and 85b have the same maximum and minimum radii at the top and bottom dead centers but are configured differently from each other in other portions to roll the printed circuit board 66 on the carrier 65 in the direction perpendicular to the direction of its travel. FIG. 15 shows the carrier 65 as seen in the direction of arrow A of FIG. 14. The cams 85b' and 85a' are configured in the same shape as the cams 85b and 85a, respectively, to support the track members 82 and 83 constantly in horizontal state.

Figure 15A:
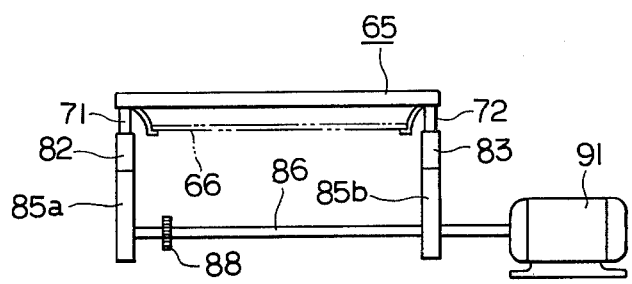
FIGS. 15(a) and 15(d) are front elevational diagrammatically showing the movement of carrier during its passage on the track members.
Figure 15B:
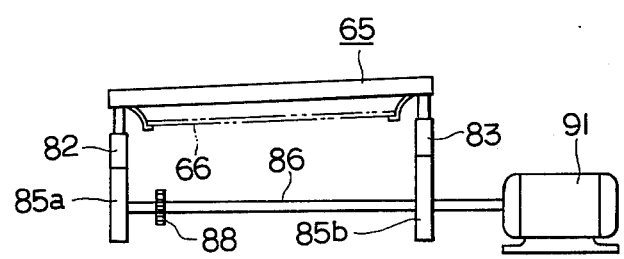
Figure 15C:
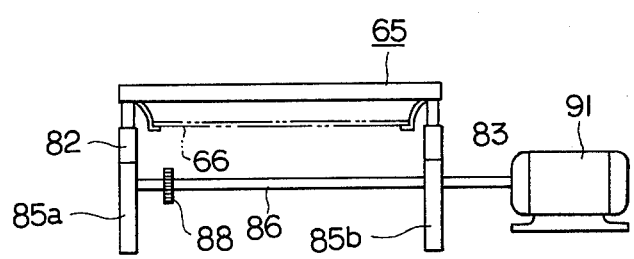
Figure 15D:
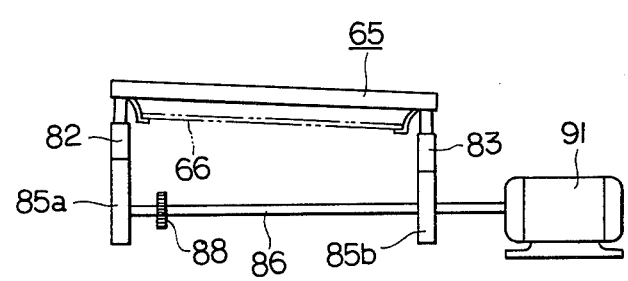

FIG. 15(a) shows the initial position where the first and second track members are supportingly engaged by the top dead centers of maximum radius of the cams 85a and 85b. FIG. 15(b) shows a lowering stage where the cams 85a and 85b have been rotated, for example, through 90° and where the cam 85a is contoured lower than the cam 85b to tilt the carrier 65 to the right as seen in the direction of its travel. In FIG. 15(c), the cams 85a and 85b have been further rotated (e.g., further 90°), supporting the carrier 65 horizontally on the respective bottom dead centers of the same minimum radius. FIG. 15(d) shows a lifting stage where the cams 85a and 85b have been further rotated (e.g., further 90°) and where the cam 85a is contoured higher than the cam 85b to tilt the carrier 65 to the left or in the reverse direction as compared with the lowering stage. Upon the cams 85a and 85b completing one revolution, the carrier 65 is returned to the level of FIG. 15(a). In this instance, the printed circuit board 66 is lowered toward the solder vessel 79 (FIG. 12) in tilted stated and dipped in the molten solder from its left side (FIG. 15(b)). After dipping in horizontal state (FIG. 15(c)), the printed circuit board 66 is lifted in tilted state to disengage from the solder surface from its left side (FIG. 15(d)), then returning to the initial horizontal state. Thus, the printed circuit boards which are continuedly moved along the transfer path are imparted with rolling movements at the soldering section.

Although the upward and downward movements of the movable rails 82 and 83 are guided by the pins 84 in the foregoing embodiment, there may be employed other guide means for this purpose. Instead of controlling the upward and downward movements of the movable rails 82 and 83 solely by the configurations of the cams 85a, 85a', 85b and 85b', there may be provided a limit switch which is adapted to be actuated when the movable rails 82 and 83 reach the respective lowermost positions to stop the motor 91 for a predetermined time period through a timer circuit, thereby holding the movable rails 82 and 83 at the respective lowermost positions for that time period.

Moreover, in a case where the timings of the movements of the cams 85a, 85a', 85b and 85b' are controlled by separate drive sources, it is possible to impart the rolling movements as in FIG. 15 even if the cams are of the same shape. If desired, the movable rails 82 and 83 may be moved up and down by means other than cams, for instance, by hydraulic means.

Figure 16:
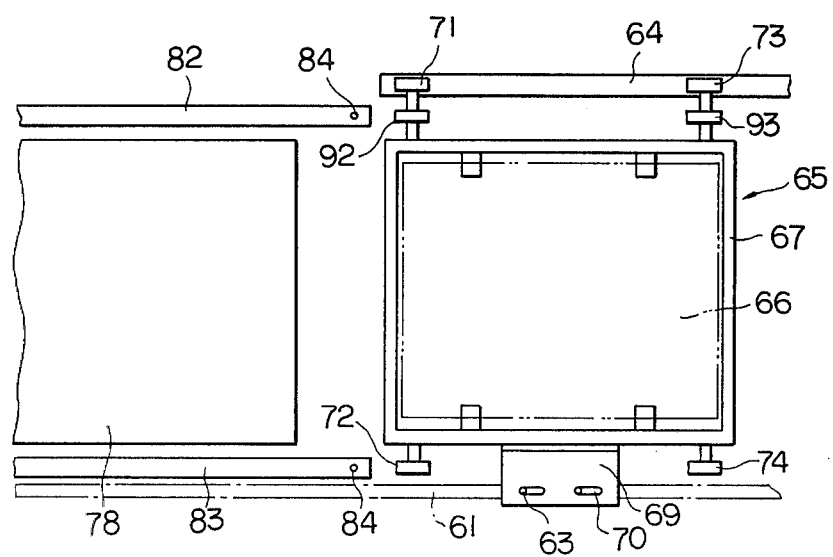
FIG. 16 is a plan view diagrammatically showing a carrier with third front and rear wheels for engagement with the first track member.

In the embodiment shown, the wheels 71 and 73 are adapted to run on both the transfer rail 64 and the first track member 82. However, third front and rear wheels 92 and 93 which are engageable with the first track member 82 may be provided on the carrier 65 on the side of the first front and rear wheels 71 and 73 which, in this case, are engageable only with the transfer rail 64 (FIG. 16).

Figure 17:
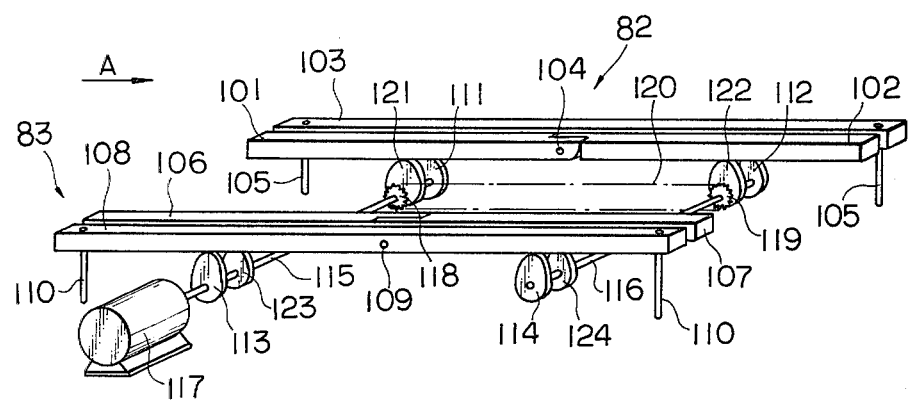
FIG. 17 is a perspective view diagrammatically showing modified construction of the first and second track members shown in FIG. 12.

FIG. 17 shows another embodiment of the first and second track members of FIG. 12. In this embodiment, the first track member 82 includes a first front sub-track 101 and a first rear sub-track 102 each having one end thereof hinged to a vertically movable first support member 103 by a pin 104. The first support member 103 is provided with through-holes at opposite ends thereof to receive guide rods 105 which are planted on the base structure (not shown). Similarly, the second track member 83 includes a second front sub-track 106 and a second rear sub-track 107 each having one end thereof hinged to a vertically movable second support member 108 by a pin 109. The second support member 108 is provided with through-holes at the opposite ends thereof to receive guide rods 110 which are planted on the base structure, not shown.

The first and second support members 103 and 108 are each provided with means for moving same vertically between its uppermost and lowermost positions. In the embodiment shown, the moving means consists of cams 111 to 114 which are rotatingly driven from a motor and supportingly engageable with the support members 103 and 108. The cams 111 and 113 are mounted on a shaft 115 which extends perpendicularly to the first and second sub-tracks. On the other hand, the cams 112 and 114 are mounted on a shaft 116 which extends parallel to the shaft 115. The cams 111 and 112 are supportingly engageable with the first support member 103 while the cams 113 and 114 are supportingly engageable with the second support member 108. The shaft 115 is connected to a rotary drive means including a motor 117 to be rotatingly driven therefrom. The shafts 115 and 116 has gear members 118 and 119, respectively, which are linked by a chain 120. Therefore, the cams 111 to 114 are operatively connected and, upon starting the motor 117, are rotatable simultaneously and in synchronism with each other about the respective shafts. Further, the cams 111 to 114 are contoured in the same shape so that by the rotation of the cams 111 to 114 the pins 104 and 109 of the first and second support members 103 and 108 are moved up and down by the same distance.

There are also provided means for rotating the first and second sub-tracks 101 and 106 about the respective hinged portions along vertical planes in synchronism with each other and means for rotating the first and second sub-tracks 102 and 107 similarly about the respective hinged portions along vertical planes in synchronism with each other. In the embodiment shown in FIG. 17, the rotating means consist of rotating cams 121 to 124 which supportingly engage the undersides of the respective sub-tracks. The cams 121 and 123 are mounted on the shaft 115 while the cams 122 and 124 are mounted on the shaft 116, the motor 117 driving them to rotate in synchronism with the cams 111 to 114. The cams 121 and 124 are contoured in the same shape so that the rotation of the cams 121 and 123 causes the first and second front sub-tracks to rotate about the respective hinged portions in synchronism with each other. Similarly, the cams 122 and 124 are contoured in the same shape so that their rotation causes the first and second rear sub-tracks to rotate about the respective hinged portions in synchronism with each other. The cams 121 and 122 (and cams 123 and 124) are contoured such that the first front and rear sub-tracks (and thus the second front and rear sub-tracks) are supported in horizontal state when the first and second support members 103 and 108 are in the afore-mentioned upper and lower positions.

The operation of the first and second track members 82 and 83 of FIG. 17 is now explained with reference to FIGS. 18(a) to 18(e). As mentioned hereinbefore, the first support member 103 and the first front and rear sub-tracks operate in the same manner as the second support member 108 and the second front and rear sub-tracks, respectively, so that FIGS. 18(a) to 18(e) show the operation of the second track member 83 alone.

Figure 18A:
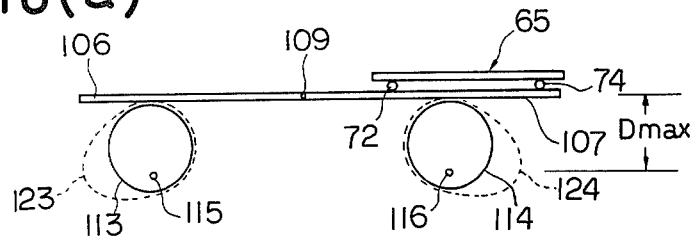
FIGS. 18(a) and 18(e) are diagrammatic side views explanatory of the operation of the front and rear sub-tracks of the second track member of FIG. 17.

As a carrier 65 which supports thereon a printed circuit board 66 is moved along the transfer rail 64 by the operation of the transfer chain 61 (FIG. 12), its front and rear wheels 72 and 74 ride onto the rear sub-track 107 of the second track member 83 as shown in FIG. 18(a). In this stage, the support member 108 (and thus the pin 109) is in the upper position (where the vertical distance D between the pin 109 and the shaft 115 is maximum ($D_{max}$)), supporting the rear sub-track 107 of the track member 83 horizontally in level with the transfer rail 64. As soon as the rear wheel 74 of the carrier 65 rides onto the sub-track 107, this is detected by a limit switch (not shown) to actuate the motor 117 (FIG. 17), starting to revolve the cams 113, 114, 123 and 124.

Figure 18B:
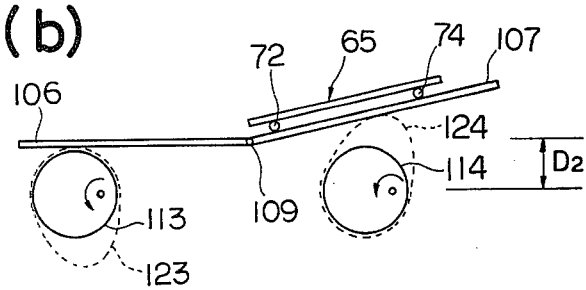

As the cams 113 and 114 are revolved, the support member 108 which engages these cams is lowered along the guide rod (FIG. 17) and the pin 109 reaches the distance $D_2$ as shown in FIG. 18(b). At this time, the front sub-track 106 which is hinged to the pin 109 is lowered therewith in horizontal state under the guidance of the cam 123 but the rear sub-track 107 is guided by the cam 124 to turn upward about the pin 109, lifting the rear end of the carrier 65.

Figure 18C:
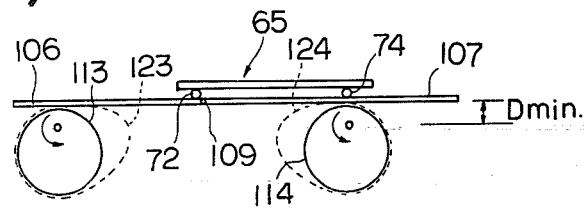

Upon further advancement of the carrier 65 and further rotation of the cams 113, 114, 123 and 124, the support member 108 is brought to the lowermost position shown in FIG. 18(c) (where the distance D becomes minimum ($D_{min}$)). In the meantime, the rear sub-track 107 is guided by the cam 124 to turn about the pin 109 again into horizontal state. While the carrier 65 is moved from the position of FIG. 18(b) to the position of FIG. 18(c), the printed circuit board 66 on the carrier begins from its fore end to contact the molten solder in the vessel 78. The entire lower surface of the printed circuit board 66 is dipped in the molten solder in the stage of FIG. 18(c). As soon as the stage of FIG. 18(c) is reached, this is detected by a limit switch (not shown) to actuate a timer (not shown) which stops the motor 117 for a predetermined time period. During this time period, the carrier 65 and the printed circuit board 66 on the carrier are moved in horizontal state.

Figure 18D:
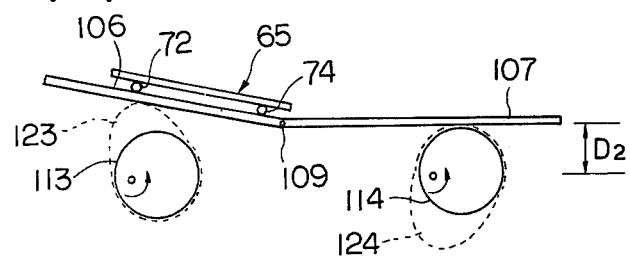

Upon lapse of the predetermined time set by the timer, the motor 117 is started again to revolve the cams 113, 114, 123 and 124. With the revolution of the cams 113 and 114, the support member begins to move upward in horizontal state and, when the pin 109 reaches the distance $D_2$, the portion of the rear sub-track 107 which is in engagement with the cam 124 is lifted with the pin 109 in horizontal state. On the other hand, the portion of the front sub-track 106 which is in engagement with the cam 123 is lifted higher than the pin 109, turning upward about the pin 109 to assume a tilted position as shown in FIG. 18(d). Thus, the fore end of the printed circuit board which is supported on the carrier is disengaged from the solder surface prior to its trailing end.

Figure 18E:
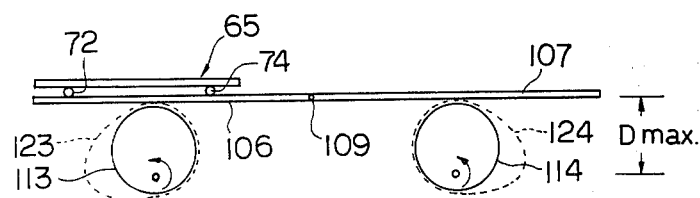

As the carrier 65 advances further from the position of FIG. 18(d) accompanied by the rotation of the cams 113, 114, 123 and 124, the front sub-track is turned in the reverse direction about the pin 109 which is in upward movement, coming into the position of FIG. 18(e), that is to say, returning to the position of FIG. 18(a). At this moment, a limit switch (not shown) is actuated to stop the motor 117 and the carrier 65 is advanced further to ride onto the rail 64 for transfer to next processing zones.

By the above-described operations of the track members 82 and 83, the printed circuit board is lowered in forwardly tilted state, then advanced in horizontal state and finally lifted in rearwardly tilted state. Therefore, the soldering operation can be effected without being troubled by the gases which otherwise tend to be trapped between the printed circuit board and the solder surface or by the deposition of undesired surplus solder on the printed circuit board.

Figure 19:
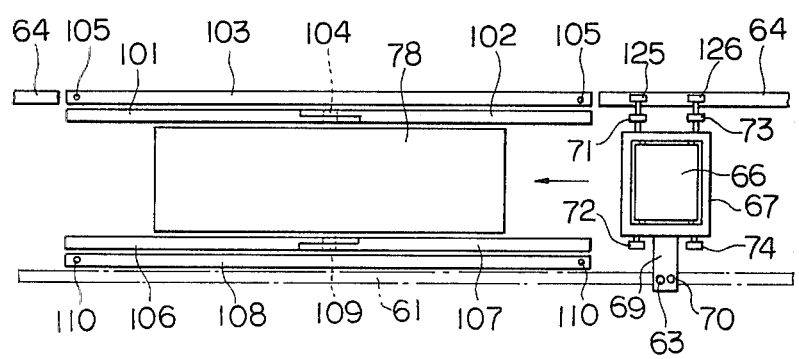
FIG. 19 is a plan view diagrammatically showing a carrier with third front and rear wheels for engagement with the first front and rear sub-tracks.

The movements of the first and second support members are guided by the guide rods 105 and 110 in the foregoing embodiment. However, any other suitable guide means may be employed for this purpose. The horizontal movement of the carrier can be attained without using the timer, for example, by contouring the cams 111 to 114 and 121 to 124 in suitable shapes. Further, the upward and downward movements of the support members 103 and 108 and/or the upward and downward movements of the first and second sub-tracks may be imparted by means other than cams, for example, by hydraulic cylinders. Moreover, instead of letting the front and rear wheels 71 and 73 run on the transfer rail 64 and the first front and rear sub-tracks 101 and 102 as in the foregoing embodiment, third front and rear wheels 125 and 126 may be provided on the carrier 65 on the side of the first front and rear wheels 71 and 73 as shown in FIG. 19, letting the third wheels run on the first front and rear sub-tracks alone and the wheels 71 and 73 on the transfer rail 64 alone. In such a case, it is possible to provide the first support member 103 in level with the first front and rear sub-tracks to engage the third wheels 125 and 126 while the carrier 65 is moving through the soldering zone 79.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. An apparatus for soldering printed circuit board, comprising:
   a carrier adapted to support a printed circuit board;
   means for moving said carrier along a predetermined transfer path;
   a moveable plate mounted for vertical movement on a support means provided adjacent a predetermined position along said transfer path;
   means for moving said moveable plate up and down by a predetermined distance;
   a pair of transversely spaced parallel rails defining part of said transfer path and adapted for supporting engagement with said carrier, said rails each rotatably attached at the center to said moveable plate;
   a link member bridged between and operatively connecting said paired rails and said moveable plate;
   a molten solder vessel located beneath the space between said rails;
   a vertically moveable element provided on and moveable with said moveable plate for engagement with one of said rails at a position distant from the center thereof;
   means for moving said moveable element up and down by a desired distance to rotate said one rail relative to the attachment point of said one rail to said moveable plate; and
   means for holding said carrier at a predetermined position on said rails,
   whereby said carrier moving means moves said carrier onto said spaced rails, over said solder vessel, and is held in position by said carrier holding means, the circuit board and said carrier being lowered into and out of said solder vessel by the paired rails being lowered and raised by movement of said moveable plate, with the angular attitude of the circuit board relative to the solder vessel being changed by movement of said vertically moveable element.

2. An apparatus for soldering a printed circuit board, comprising:

a carrier adapted to suport a printed circuit board and to be moved along a predetermined transfer path;

first front and rear wheel members mounted at one side of said carrier and second front and rear wheel members mounted at the other side of said carrier;

a pair of laterally spaced and vertically moveable parallel first and second track members located to define part of said transfer path, said first track member being engageable with said first front and rear wheel members of said carrier and said second track member being engageable with said second front and rear wheel members thereby to support said carrier;

a molten solder vessel provided beneath the space between said first and second track members;

means for moving said carrier along said transfer path and supportingly engageable with a part of said carrier at said other side; and drive means for moving said first and second track members vertically between uppermost and lowermost positions, dipping the underside of said board on said carrier in the molten solder in said vessel at said lowermost position, said drive means including cam members supportingly engaging opposite end portions on the underside of said first and second track members, and means for rotatingly driving said cam members.

3. An apparatus as defined in claim 2, wherein said drive means for said first and second track members is adapted to move said first track member with a phase difference from the upward and downward movements of said second track member to cause said printed circuit board to contact the molten solder in a tilted state and then to disengage therefrom in reversely tilted state.

4. An apparatus as defined in claim 2, further comprising a transfer track member defining said transfer path together with said first track member by forming a continuous track therewith when the latter is in said uppermost position.

5. An apparatus as defined in claim 2, further comprising a transfer track member defining said transfer path together with said first track member and located discontinuously therefrom, and third front and rear wheels mounted on said carrier at said one side thereof and engageable with said transfer track member.

6. An apparatus for soldering a printed circuit board, comprising:

a carrier adapted to support a printed circuit board and to be moved along a predetermined transfer path;

first front and rear wheel members mounted at one side of said carrier and second front and rear wheel members mounted at the other side of said carrier;

a pair of laterally spaced and vertically moveable parallel first and second track members located to define part of said transfer path, said first track member being engageable with said first front and rear wheel members of said carrier and said second track member being engageable with said second front and rear wheel members thereby to support said carrier;

said first track member includes first front and rear sub-tracks each having one end hinged to a vertically moveable first support member, and said second track member includes second front and rear sub-tracks each having one end hinged to a vertically moveable second support member;

a molten solder vessel provided beneath the space between said first and second track members;

means for moving said carrier along said transfer path and supportingly engageable with a part of said carrier at said other side;

drive means coupled to said first and second support members for moving said first and second track members vertically between uppermost and lowermost positions, dipping the underside of said board on said carrier in the molten solder in said vessel at said lowermost position; and means for rocking said first and second sub-tracks about the respective hinged ends.

7. An apparatus as defined in claim 6, wherein said drive means for said first and second track members includes eccentric cams supportingly engaging the underside of said first and second support members and means for driving said eccentric cams.

8. An apparatus as defined in claim 6 or 7, wherein said drive means for said first and second sub-tracks includes eccentric cams supportingly engaging the underside of said sub-tracks at positions away from the respective hinged ends, and means for driving said eccentric cams.

9. An apparatus as defined in claim 6, further comprising a transfer track member defining said transfer path together with said first track member by forming a continuous track when the latter is in said uppermost position.

10. An apparatus as defined in claim 6, further comprising a transfer track member defining said transfer path together with said first track member and located discontinuously therefrom, and third front and rear wheels mounted on said carrier at said one side thereof and engageable with said transfer track member.

* * * * *